(12) United States Patent
Chen et al.

(10) Patent No.: US 12,151,324 B2
(45) Date of Patent: Nov. 26, 2024

(54) METHODS FOR INSERTING A FASTENER INTO A WAFER CARRIER

(71) Applicant: Taiwan Semiconductor Manufacturing Company, Hsinchu (TW)

(72) Inventors: Yu-Chen Chen, Hemei Township (TW); Chih-Hung Huang, Hsinchu (TW); Cheng-Lung Wu, Zhunan Township (TW); Yang-Ann Chu, Hsinchu (TW); Jiun-Rong Pai, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/199,633

(22) Filed: May 19, 2023

(65) Prior Publication Data

US 2023/0302589 A1    Sep. 28, 2023

Related U.S. Application Data

(62) Division of application No. 17/671,795, filed on Feb. 15, 2022, now Pat. No. 11,752,582.

(51) Int. Cl.
*B23P 11/00* (2006.01)
*B23P 19/06* (2006.01)
(Continued)

(52) U.S. Cl.
CPC .............. *B23P 19/06* (2013.01); *B23P 11/00* (2013.01); *B25B 23/10* (2013.01);
(Continued)

(58) Field of Classification Search
CPC .......... B23P 19/06; B23P 19/04; B25B 23/08; B25B 23/10
See application file for complete search history.

(56) References Cited

U.S. PATENT DOCUMENTS

| 6,797,076 | B1 * | 9/2004 | Bryer | ............ H01L 21/6704 |
| | | | | 134/36 |
| 7,216,655 | B2 * | 5/2007 | Halbmaier | ............ B08B 3/02 |
| | | | | 134/171 |

(Continued)

FOREIGN PATENT DOCUMENTS

| CN | 207480016 U | 6/2018 |
| CN | 208729104 U | 4/2019 |

(Continued)

*Primary Examiner* — Sarang Afzali
(74) *Attorney, Agent, or Firm* — Lippes Mathias LLP

(57) ABSTRACT

The present disclosure relates to methods for inserting a fastener into a wafer-carrying pod. The system includes a robotic arm with a screw tool assembly disposed at the far end of the robotic arm. The screw tool assembly includes a lower sleeve configured to receive a fastener. A screwdriver is disposed within an upper sleeve of the screw tool assembly, and a motor is provided to rotate the screwdriver. In use, the screw tool assembly is positioned over the fastener so the lower sleeve surrounds the fastener and the screwdriver engages the fastener. The fastener head is received within the lower sleeve, and the screwdriver screws the fastener into the pod.

20 Claims, 13 Drawing Sheets

(51) Int. Cl.
*B25B 23/10* (2006.01)
*B25J 15/00* (2006.01)
*H01L 21/673* (2006.01)

(52) U.S. Cl.
CPC ...... *B25J 15/0019* (2013.01); *H01L 21/6732* (2013.01); *Y10T 29/49819* (2015.01)

(56) References Cited

U.S. PATENT DOCUMENTS

| | | | | |
|---|---|---|---|---|
| 7,409,756 | B2* | 8/2008 | Sirilutporn | G11B 33/12 |
| 8,726,769 | B1* | 5/2014 | Jacker | B25B 23/101 |
| | | | | 81/451 |
| 10,363,661 | B2* | 7/2019 | Ueda | B25J 9/1633 |
| 2015/0283683 | A1* | 10/2015 | Ilzarbe Ripoll | B25B 23/101 |
| | | | | 81/451 |

FOREIGN PATENT DOCUMENTS

| | | |
|---|---|---|
| CN | 113798840 A | 12/2021 |
| TW | I571951 B | 2/2017 |
| TW | I688035 | 3/2020 |
| TW | M602078 U | 10/2020 |

\* cited by examiner

METHODS FOR INSERTING A FASTENER INTO A WAFER CARRIER

PRIORITY CLAIM AND CROSS-REFERENCE

This application is a division of U.S. patent application Ser. No. 17/671,795, filed on Feb. 15, 2022, now U.S. Pat. No. 11,752,582, which is incorporated by reference in its entirety.

BACKGROUND

Semiconductor integrated circuits may be produced through a plurality of processes applied to a semiconductor wafer substrate. Such processes may include thermal oxidation, diffusion, ion implantation, RTP (rapid thermal processing), CVD (chemical vapor deposition), PVD (physical vapor deposition), etching, and photolithography. Semiconductor wafer substrates are placed in an enclosed wafer carrier for storage between process steps and for transportation between various processing machines. Those wafer carriers must meet high standards for cleanliness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8A shows a first position of a screw tool assembly.
FIG. 8B shows a second position of the screw tool assembly.
FIG. 8C shows a third position of the screw tool assembly.
FIG. 8D shows a fourth position of the screw tool assembly.

FIG. 10A shows a first position of a screw tool assembly.
FIG. 10B shows a second position of a screw tool assembly.
FIG. 10C shows a third position of a screw tool assembly.
FIG. 10D shows a fourth position of a screw tool assembly.

DETAILED DESCRIPTION

Figure 1:
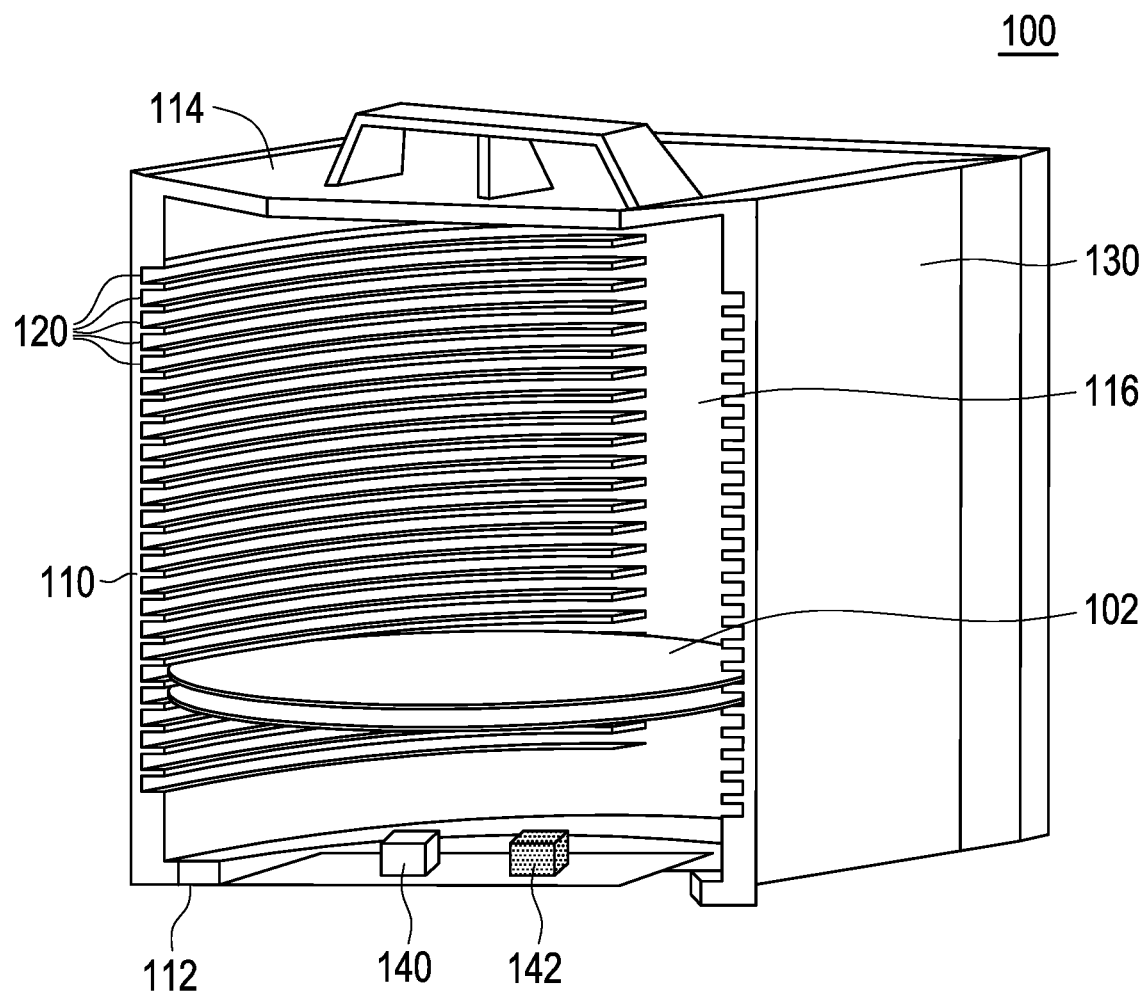
FIG. 1 is a FOUP (Front Opening Unified Pod) used as an example to illustrate the wafer carriers used in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to robotic systems which can remove or insert one or more fasteners, such as a screw, into a wafer carrier. In certain embodiments, the fastener comprises a combination of elements including a head, a shank, and an external thread wrapped around the shank. It is particularly contemplated that the fastener(s) are used to attach a door to the wafer carrier, and these robotic systems can be used when access to the internal volume of a wafer carrier is desired. The robotic systems include a screw tool assembly that can be used to unscrew the fastener, capture the fastener, and move the fastener to another location. The use of such robotic systems can improve productivity by potentially reducing the need for human or other manual involvement. In some particular embodiments, the robotic systems are used prior to introducing the wafer carrier into a cleaning system.

As some background, integrated circuits are fabricated on semiconductor wafer substrates by performing various processing steps, such as deposition, removal, patterning, electrical modification, and the like, on the semiconductor wafer substrates. The wafer substrates need to be protected from contaminants such as particles, organics, gases, metallics, water and the like, which may adhere to or adversely affect the desired properties of the integrated circuits being built thereon. For example, contamination of the semiconductor wafer substrates may cause defects in the integrated circuits formed thereon, which can result in a drop in semiconductor device yield.

To address the contamination concern, the semiconductor wafer substrates are transported between the various semiconductor processing apparatuses using wafer carriers or transport pods, which have a controlled environment therein and prevent contamination of the semiconductor wafer substrates. Such wafer carriers may be known in the art as a Front Opening Unified Pod (FOUP), a Front Opening Shipping Box (FOSB), or a Standard Mechanical InterFace (SMIF).

FIG. 1 illustrates a FOUP 100 which is used as an example of the wafer carriers that can be used in some embodiments of the present disclosure. The FOUP 100 acts as a storage container and carrier for wafer substrates 102 therein. The FOUP is formed from a sidewall 110 disposed on a base 112 and joined with a lid 114, which together define an interior volume 116 for storing several wafer substrates 102. As seen here, a plurality of slots 120 is formed in the sidewall 110 of the pod 100, and each slot is able to hold a substrate within the interior volume of the pod in a desired position. The pod also includes a front door 130 for accessing the interior volume. The front door 130 may be movable or removable or separable from the sidewall 110, so as to permit the substrates to be transferred in and out of the FOUP. As illustrated here, the front door is moved to one side of the pod. The dimensions of the FOUP may vary, depending on the size of the substrate that needs to be accommodated. In this regard, photolithographic processes may be performed on wafer substrates having diameters of about 200 mm, or about 300 mm, or about 450 mm, depending on the generation of the tooling being used, and so the dimensions of the FOUP will change as well.

The FOUP 100 also includes a purge inlet 140 and a purge outlet 142, which are illustrated here as being located on the base of the FOUP. When the front door is closed so as to separate the interior volume of the FOUP from the exterior environment, the interior volume can be purged of contaminants. An exterior gas source is attached to the purge inlet, and a vacuum source is attached to the purge outlet.

A cleaning gas, such as nitrogen gas ($N_2$) or clean dry air (CDA), can be introduced into the interior volume 116 of the FOUP to purge contaminants that may be present therein, either in the air or as deposits on the surfaces within the interior volume. The introduction of the cleaning gas, along with gentle suction through the purge outlet, creates a flow path through the interior volume and around any substrates that leads contaminants out of the interior volume. Such contaminants may include moisture, oxygen, particles, and chemical residues such as $NH_3$, $SO_4$, F, Cl, $NO_3$, $PO_4$, etc.

A clean and secure environment is thus provided for the wafer substrates housed therein.

Figure 2:
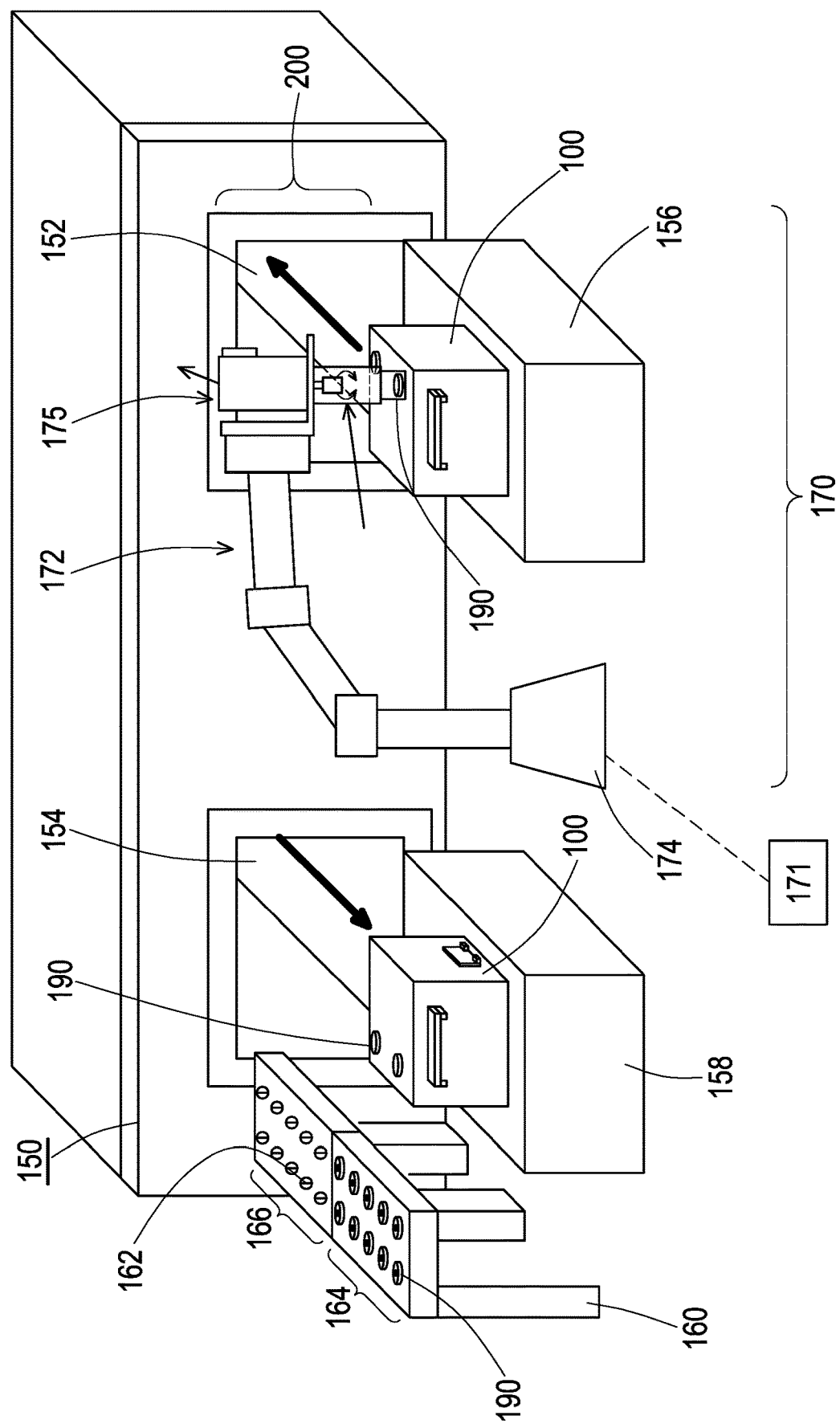
FIG. 2 illustrates a system for removing and inserting fasteners from and to a wafer carrier in accordance with some embodiments of the present disclosure.

FIG. 2 illustrates one environment in which the robotic systems of the present disclosure may be used. A cleaning system 150 for the wafer carrier 100 is illustrated. The cleaning system 150 includes an entry door 152 and an exit door 154, which are located on the same side of the system. An entry load port 156 is present in front of the entry door 152, and an exit load port 158 is present in front of the exit door 154.

As illustrated here, a wafer carrier 100 is placed on the entry load port 156. The wafer carrier itself is empty, and no semiconductor wafer substrates are present. The fasteners which affix the door to the wafer carrier are removed, so the door can be removed and the interior volume of the wafer carrier can be accessed during the cleaning process that occurs within the cleaning system. The wafer carrier then enters the cleaning system through the entry door 152 (indicated with arrow). A cleaned wafer carrier 100 exits the cleaning system through exit door 154 and is received at exit load port 158. Here, the door may be put in place, and fasteners may be inserted to fix the door in position on the wafer carrier.

The robotic system 170 for inserting and removing fasteners from the wafer carrier is also illustrated in FIG. 2. The system includes a robotic arm 172 with a base 174 which is fixed in place relative to the entry load port 156 and/or the exit load port 158. This locates the wafer carrier(s) in a known position relative to the robotic arm. A screw tool assembly 200 is attached to an operating end 175 of the robotic arm, and is used to engage the fasteners 190 of the wafer carrier.

The robotic system 170 can further include a screw buffer table 160. The screw buffer table acts as or provides a holding area for fasteners which have been removed from the wafer carriers. Generally speaking, the screw buffer table 160 includes a plurality of apertures 162 for holding the fasteners. In this regard, it is noted that all of the fasteners must be held in a constant position, so that the fasteners can be consistently engaged by the robotic system. Thus, the fasteners cannot simply be loosely placed in a container. If desired, each aperture may also include a thread for engaging the fastener. Alternatively, each aperture may be sized to provide an interference or pressure fit with the fastener.

As illustrated here, the screw buffer table 160 is divided into two separate areas 164, 166. Area 164 is illustrated as holding a plurality of fasteners 190, whereas area 166 is empty, with the apertures 162 being visible. In some methods of the present disclosure, it is contemplated that area 166 can act as a "used" fastener area, and area 164 can act as a "new" fastener area. Fasteners removed from a wafer carrier at the entry load port 156 would be placed by the robotic system into "used" fastener area 166, and fasteners inserted into a wafer carrier at the exit load port 158 would be obtained from "new" fastener area 164.

The robotic system 170 can be autonomously operated by a controller 171. The controller can be pre-programmed with location information for various items such as the screw buffer table 160 and the apertures therein, the entry load port 156, and the exit load port 158. These pre-programmed locations allow the controller to move the robotic arm between these locations. The controller may operate a computer program which identifies desirable parameters and alters other parameters as appropriate. The controller may also include a user interface for communicating with operators. If necessary, the robotic system 170 can also be manually operated through the user interface.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

Figure 3:
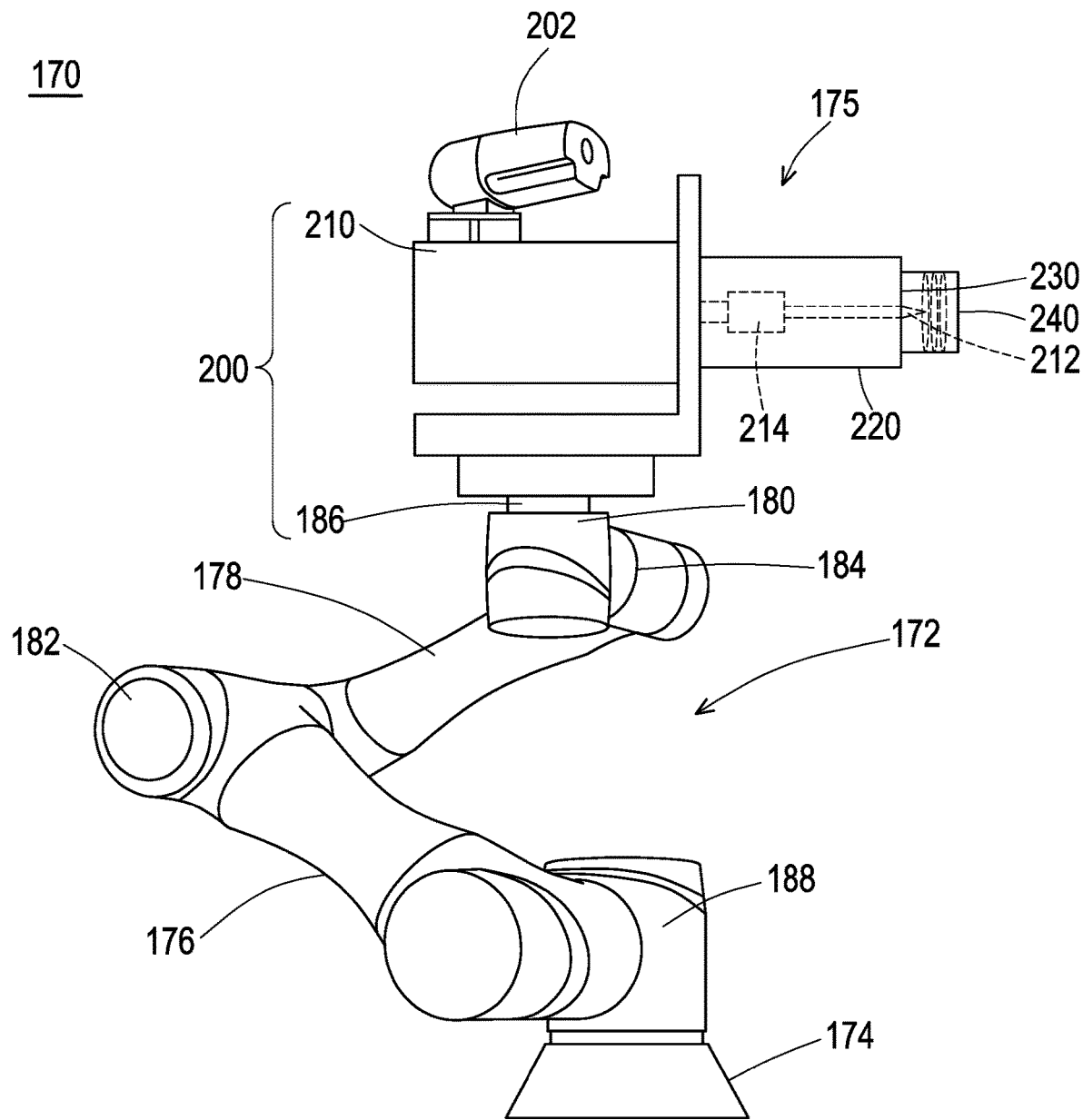
FIG. 3 depicts a side view of a robotic system for removing and inserting fasteners of a wafer carrier, according to some embodiments of the present disclosure.

FIG. 3 is a side view of the robotic system 170, according to some embodiments of the present disclosure. As previously mentioned, the robotic system includes a base 174 which connects the robotic arm 172 to the floor and provides support. As illustrated here, the robotic arm 172 includes three separate arm segments 176, 178, 180. Arm segment 176 may be considered a trunk, arm segment 178 may be considered an upper arm, and arm segment 180 may be considered a lower arm. Arm segments 176 and 178 are joined by a joint 182 which may be considered a shoulder. Arm segments 178 and 180 are joined by a joint 184 which may be considered an elbow. The screw tool assembly 200 is joined to arm segment 180 by a joint 186 which may be considered a wrist. In addition, joint 188 joins the base 174 to arm segment 176. Each joint permits rotation about two different axes. Generally, it is desired that the robotic arm has at least six degrees of freedom. In some additional embodiments, it is possible that the length of an arm segment may change as well, or in other words one or more of the arm segments may be telescopic. The number of arm segments and joints, as well as the lengths of the arms, may vary as desired. Various components, such as motors, hydraulics, and other electrical and mechanical parts are not shown, though present.

Continuing with FIG. 3, the screw tool assembly 200 is disposed at the operating end 175 of the robotic arm, opposite the base 174. The screw tool assembly 200 includes a screwdriver motor 210, which is used to power the rotation of the screwdriver head 212. As illustrated here, the screwdriver motor 210 is attached to the wrist joint 186. The screwdriver head 212 is mounted in a shank 214. It is contemplated that the head 212 may be removed or separated from the shank 214 and replaced if needed. The screwdriver can be rotated clockwise or counterclockwise to screw and unscrew the fasteners.

An upper sleeve element 220 is attached to the screwdriver motor 210. The screwdriver head 212 is disposed within the upper sleeve element 220. The upper sleeve element 220 includes a lower aperture 230, and a lower sleeve element 240 extends through the lower aperture. As indicated here, the lower sleeve element 240 is a telescopic structure which can move up-and-down (i.e. vertically) within the lower aperture 230, or put another way may enter into the upper sleeve element 220.

A camera 202 is also illustrated, which is located proximate the operating end 175 of the robotic arm 172. Here, the camera is attached to the screw tool assembly, and more specifically the screwdriver motor 210. The camera can be used to provide more specific location information during movement and operation of the robotic system, with the controller using the camera images to make adjustments such that all components align in a desired manner. It is noted that additional sensors may be used to identify the location of the various parts of the robotic system. For example, additional cameras may be positioned around the working area, or location-identifying components could be placed on various parts of the robotic system, the wafer carriers, the screw buffer table, etc.

Figure 4:
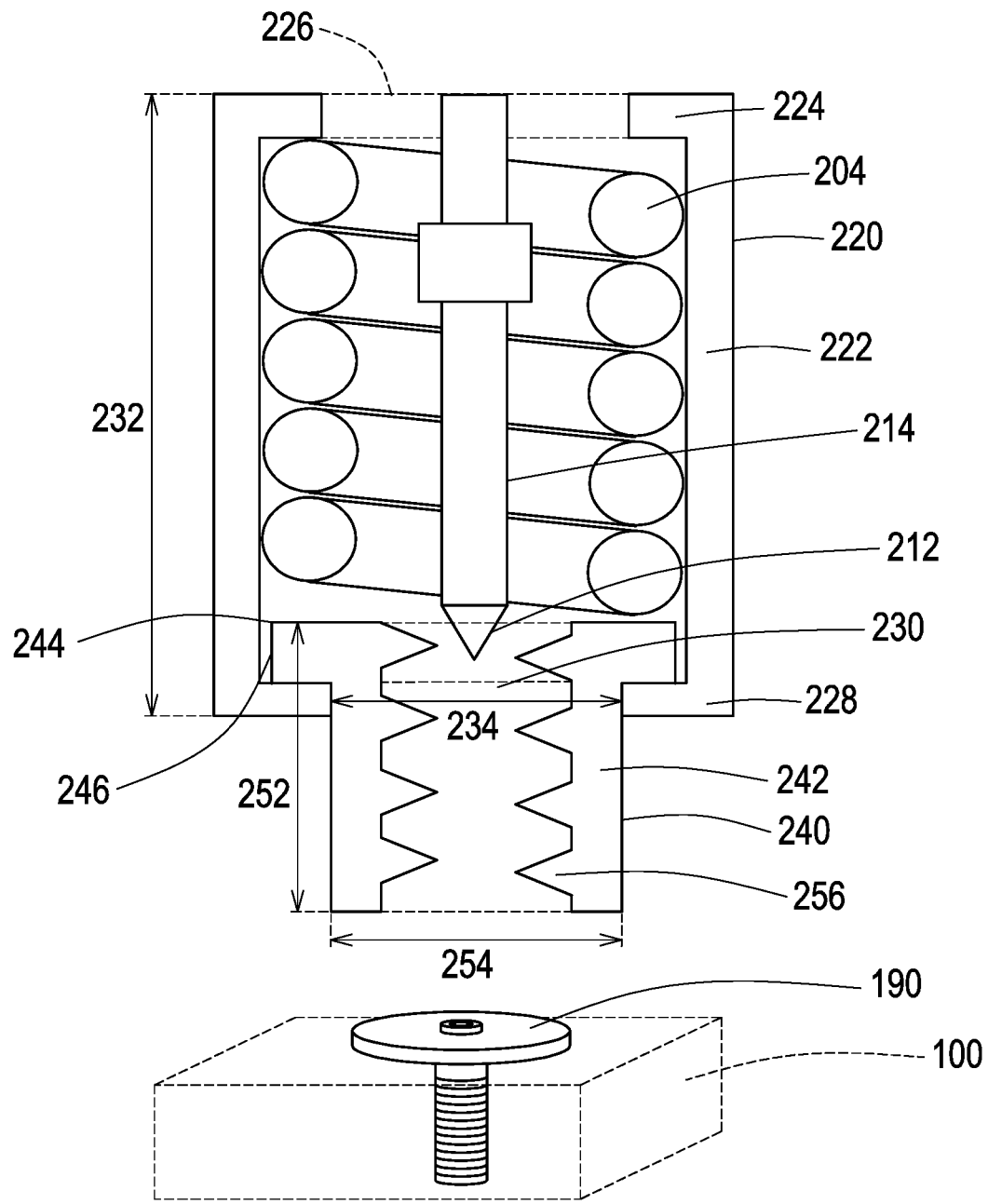
FIG. 4 depicts a side cross-sectional view of an exemplary screw tool assembly, in accordance with some embodiments of the present disclosure.

FIG. 4 is a side cross-sectional view showing more details of the upper sleeve element 220 and the lower sleeve element 240. Also illustrated for reference is the fastener 190 which is inserted into wafer carrier 100. Initially, the upper sleeve element 220 generally has a cylindrical shape, and is formed from a cylindrical sidewall 222 with ends closed by an upper base 224 and a lower base 228. An upper aperture 226 is present in the upper base 224, and a lower aperture 230 is present in the lower base 228. As indicated here, the screwdriver shank 214 extends through the upper aperture 226, such that the screwdriver head 212 is located within the upper sleeve element 220. The upper sleeve element has a height 232. The lower aperture 230 has a width 234.

The lower sleeve element 240 also generally has a cylindrical shape, and is formed from a cylindrical sidewall 242. The ends of the sidewall are open. The lower sleeve element is sized to extend through the lower aperture 230 of the upper sleeve element 220 and move telescopically therethrough. As seen here, the width 254 of the lower sleeve element 240 is less than the width 234 of the lower aperture. The upper end 244 of the lower sleeve element includes a lip 246 extending outwards from the sidewall 242. The lip 246 engages the lower base 228 of the upper sleeve element, joining the upper sleeve element 220 and the lower sleeve element 240 together. The lower sleeve element has a height 252 and a width 254. It is noted that the lower sleeve element 240 cannot rotate relative to the upper sleeve element 220, and does not rotate as it telescopes up and down within the upper sleeve element.

An internal thread 256 is present on the inside of the sidewall 242 of the lower sleeve element. The internal thread may run up the entire height of the sidewall, or may run only partially up the sidewall. The internal thread does not have to be continuous, and can be broken into several portions if desired.

A compression spring 204 is located within the upper sleeve element 220. The compression spring is long when no load is applied, and gets shorter as a load is applied. The compression spring engages the lip 246 of the lower sleeve element, and biases the lower sleeve element to extend through the lower aperture 230 of the upper sleeve element. The spring compresses as the lower sleeve element 240 is pushed into the upper sleeve element 220, and expands when load is removed. The upper end of the compression spring may engage the upper base 224 as illustrated here, or alternatively the upper aperture 226 may be large enough that the upper end of the compression spring engages the motor.

Figure 5:
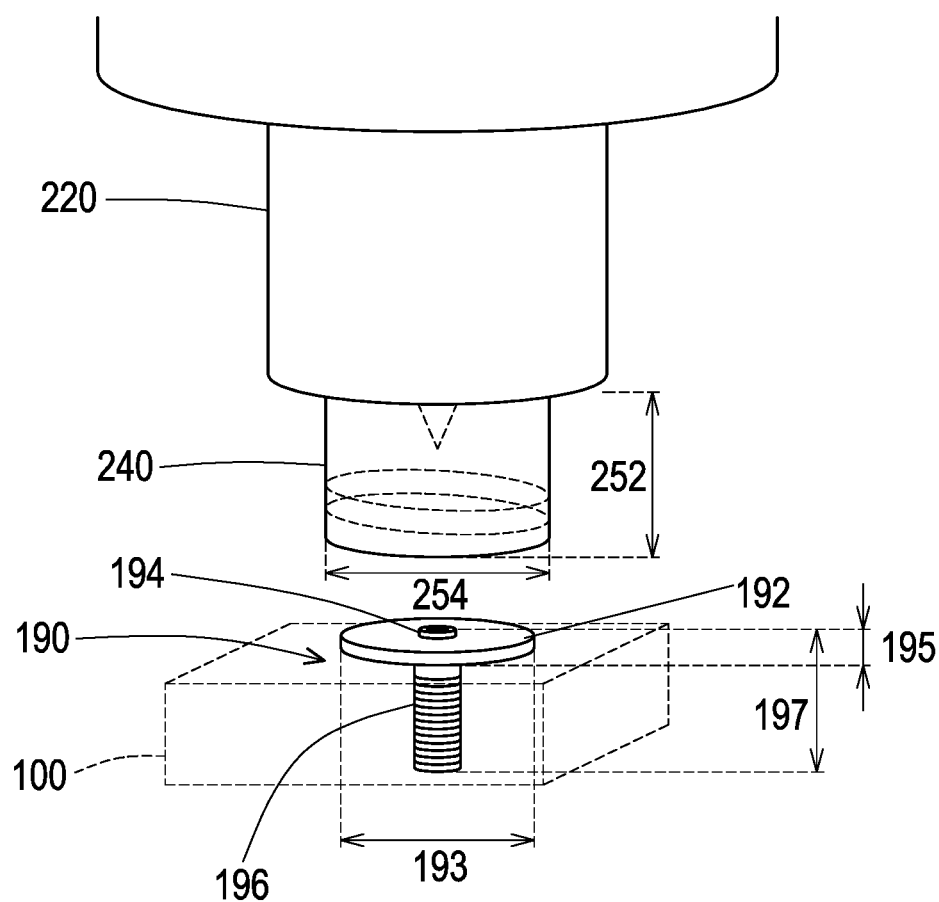
FIG. 5 depicts a perspective view of an exemplary screw tool assembly, in accordance with some embodiments of the present disclosure.

FIG. 5 is a perspective view of the screw tool assembly 200 along with the fastener 190. The upper sleeve element 220 and the lower sleeve element 240 are shown. As previously indicated, the lower sleeve element has a height 252 and a width 254.

As illustrated here, the fastener 190 includes a head 192 and a shank 196. The shank has an external thread, is shown inserted into a wafer carrier 100 which has an internal thread for engaging the external thread. A fastener drive or socket 194 is also present in the head 192. In use, the screwdriver head will engage the drive/socket, so that the fastener can be rotated.

Continuing, the fastener head 192 has a diameter 193, which may be from about 10 millimeters (mm) to about 20 mm. The width 254 of the lower sleeve element is greater than the diameter 193 of the fastener head.

The fastener 190 has a length 197, which extends from head to shank. In some embodiments, the height 252 of the lower sleeve element is greater than the length 197 of the entire fastener. This permits the lower sleeve element to retain the entire fastener, or in other words the fastener can be housed entirely within the lower sleeve element. Generally, the height 252 of the lower sleeve element must be greater than the height 195 of the fastener head 192. The lower sleeve element should receive at least the fastener head. In some embodiments, the height 195 of the fastener head is from about 1 mm to about 2 mm.

In certain embodiments illustrated here, the fastener comprises a head, a shank, and an external thread wrapped around the shank, which is sometimes called a male screw. It is also contemplated that the fastener may comprise a head, a barrel, and an internal thread within the barrel, which is sometimes called a female bolt, a barrel bolt, or a binding barrel. This female bolt would engage a male screw present in the wafer carrier.

Figure 6:
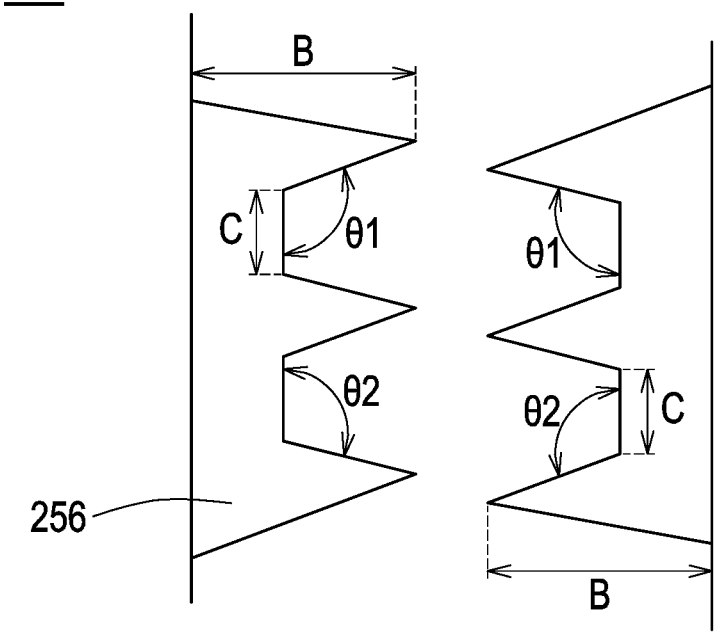
FIG. 6 depicts a cross sectional view of the lower sleeve element, in accordance with some embodiments of the present disclosure.

FIG. 6 depicts a cross-sectional view of the lower sleeve element 240, and focuses on the internal thread 256. The internal thread 256 should have at least one complete turn, and may have multiple turns. The internal thread 256 is illustrated here with three turns. The distance between threads is called the pitch, and is indicated with reference letter C. Thread pitch C is equal to or greater than the fastener head height 195. In particular embodiments, the ratio of the thread pitch C to the fastener head height 195 is about 1.2 or greater. The ratio may be a maximum of 3. The thread depth is indicated with reference letter B. In particular embodiments, the thread depth is up to about 1 mm. In particular embodiments, the minimum thread depth is about 0.5 mm. Lower thread angle θ1 and upper thread angle θ2 are equal to each other, and may range from greater than 90° (degrees) to about 170°.

The various components of the robotic systems and the wafer carriers can be made as desired from conventional materials, such as plastics and/or metals. The various components and their shapes and sizes can be made using conventional manufacturing techniques.

Figure 7:
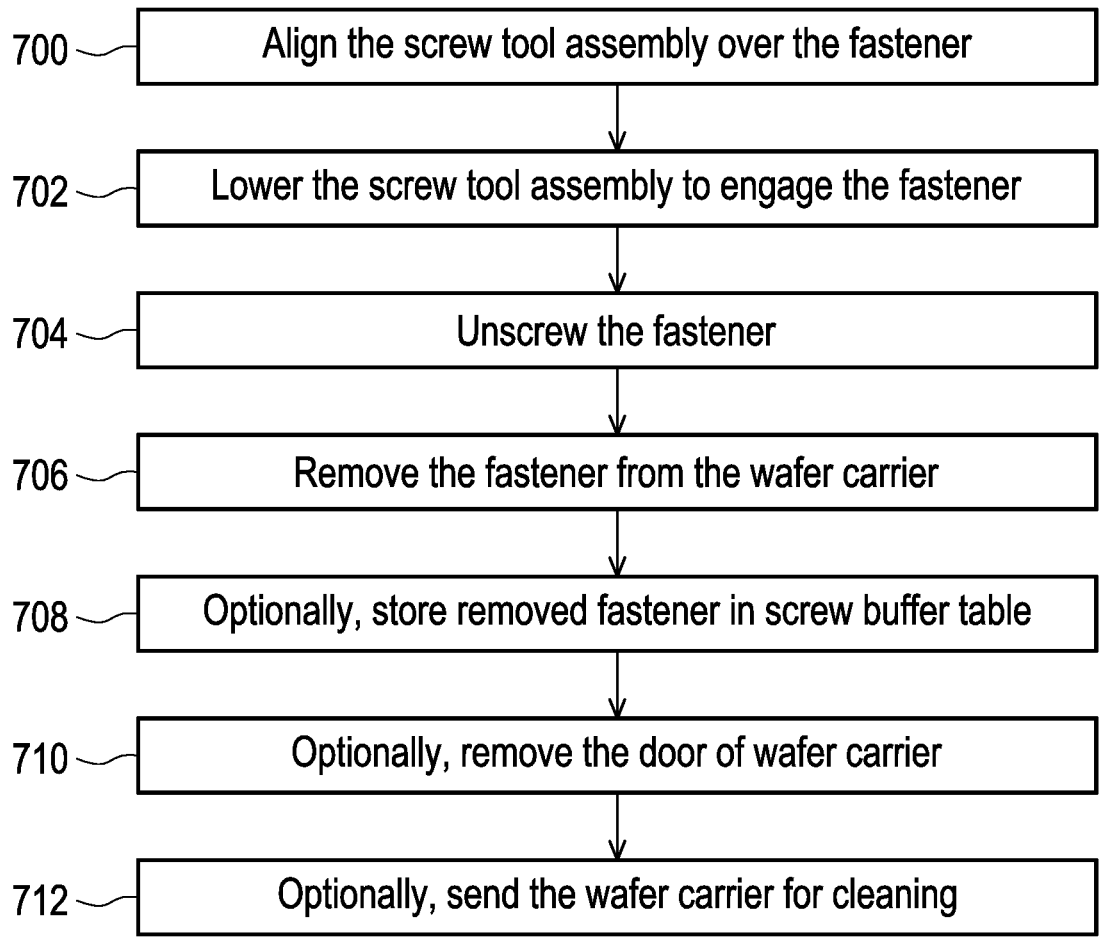
FIG. 7 is a flow chart illustrating an exemplary method for removing a fastener from a wafer carrier, in accordance with some embodiments of the present disclosure.

FIG. 7 is a flow chart illustrating an exemplary method for removing a fastener from a wafer carrier in accordance with some embodiments of the present disclosure. This method is also illustrated in FIGS. 8A-8D, and will be discussed together.

Figure 8A:
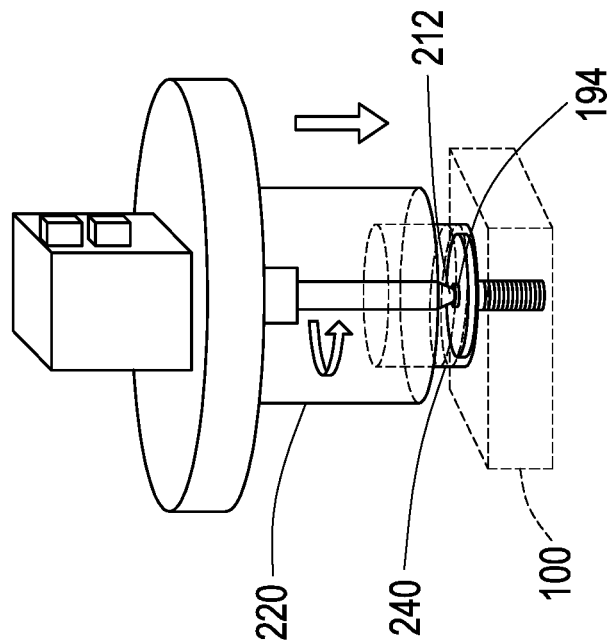
FIG. 8A-8D are a set of drawings illustrating the steps of the method of FIG. 7, in accordance with some embodiments of the present disclosure.

First, in step 700, the screw tool assembly is aligned over the fastener. Again, the fastener may be secured in a FOUP, POD, or other substrate container. The fastener holds the door of the wafer carrier in place. The robotic arm is moved to position the screw tool assembly over the fastener. This may be done using information from the pre-programmed locations and camera images. Referring to FIG. 8A, fastener 190 is shown inserted into wafer carrier 100. The lower sleeve element 240 of the screw tool assembly surrounds the head 192 of the fastener. The screwdriver head 212 is aligned with the drive 194 of the head of the fastener.

Figure 8B:
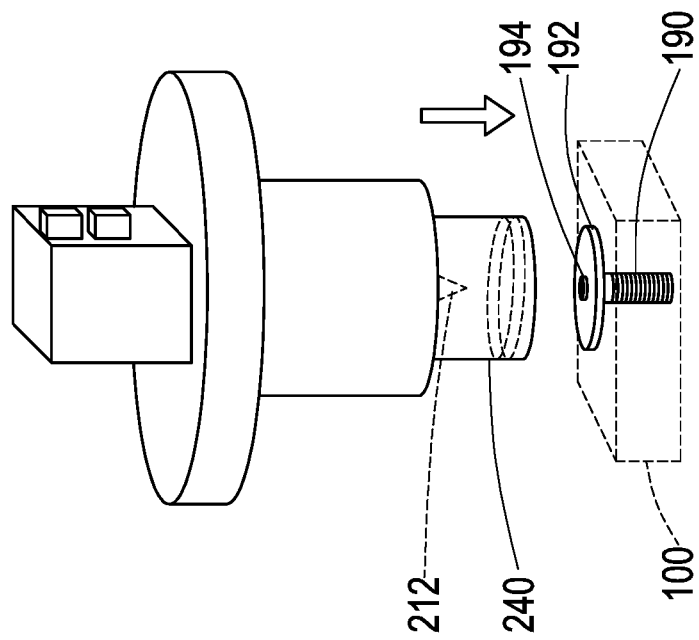

Next, in step 702, the screw tool assembly is lowered such that the screwdriver head engages the fastener. Referring to FIG. 8B, when the screw tool assembly is pushed downwards against the wafer carrier 100, the lower sleeve element 240 is pushed into the upper sleeve element 220 and the screw drive 194 of the fastener is engaged by the screwdriver head 212 within the upper sleeve element.

Next, in step 704, the fastener is unscrewed. Referring to FIG. 8C, the screwdriver head 212 is rotated counterclockwise by the motor 210 to loosen the fastener 190. The upper sleeve element 220 and the lower sleeve element 240 remain stationary and do not rotate with the screwdriver head 212. As the fastener loosens, the head 192 of the fastener is captured by the internal thread 256, allowing the lower sleeve element to retain the fastener head. In addition, the screw tool assembly moves upwards as the fastener is unscrewed from the wafer carrier 100. This can be seen by comparing FIG. 8C with FIG. 8B, wherein the lower sleeve element 240 is no longer within the upper sleeve element 220 but is still pushed against the wafer carrier 100.

Figure 8D:
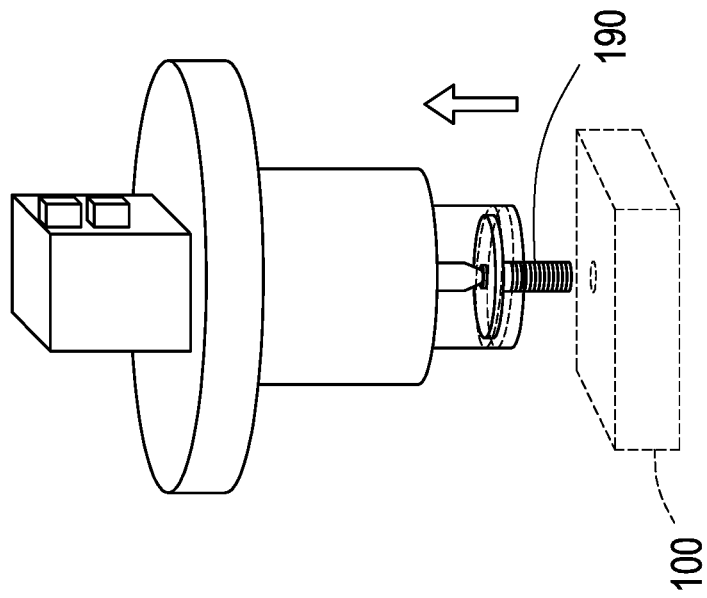
Figure 8C:
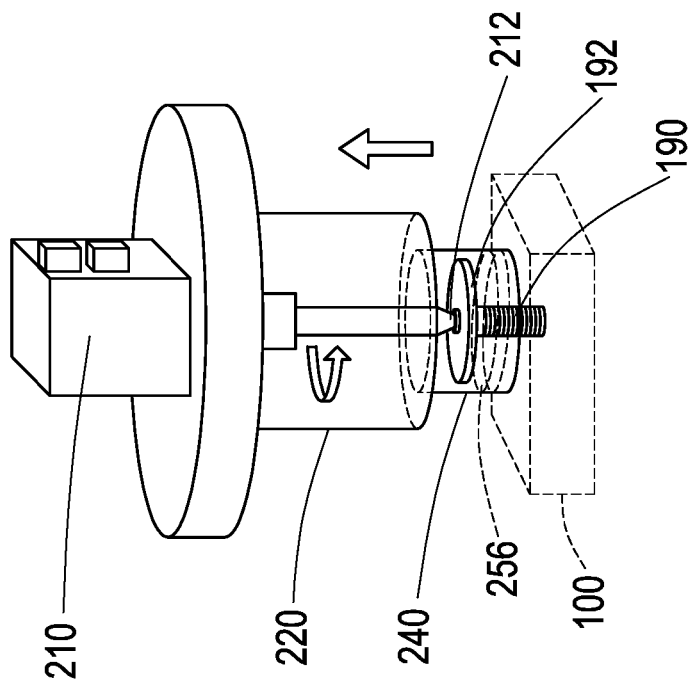

Finally, in step 706 and illustrated in FIG. 8D, the fastener 190 is completely removed from the wafer carrier 100. Referring now to FIGS. 8A-8D together, the telescoping motion of the lower sleeve element 240 provides the screw tool assembly 200 with the advantage of being able to capture the fastener as the fastener moves up and out of the wafer carrier. The lower sleeve element 240 must continue to be pressed against the fastener head 192 during the unscrewing to capture the fastener, but the distance between the wafer carrier 100 and the screwdriver head 212 must also increase during the unscrewing to accommodate the fastener shank 196 coming out of the wafer carrier. The telescopic lower sleeve element permits both actions to occur, since the screw tool assembly can be moved upwards (so the distance between the wafer carrier and the screwdriver head increases) while the lower sleeve element remains pressed against the fastener head. Other alternative structures that would permit both actions to occur, such as having the screwdriver head itself move telescopically, would require more mechanical modifications, would be more expensive to implement, would be more difficult to service, and would require additional software modifications to control such movement independently from the movement of the robotic arm 170.

In optional step 708, and referring back to FIG. 2, the robotic arm 172 can be moved to the screw buffer table 160, and the fastener can be released into an empty aperture in the screw buffer table. As necessary, the fastener can be screwed into the aperture by rotating the screwdriver head.

In optional step 710, the door of the wafer carrier, which was previously held in place by the fastener, can be removed from the wafer carrier. In optional step 712, the wafer carrier can then be sent to a cleaning system.

Figure 9:
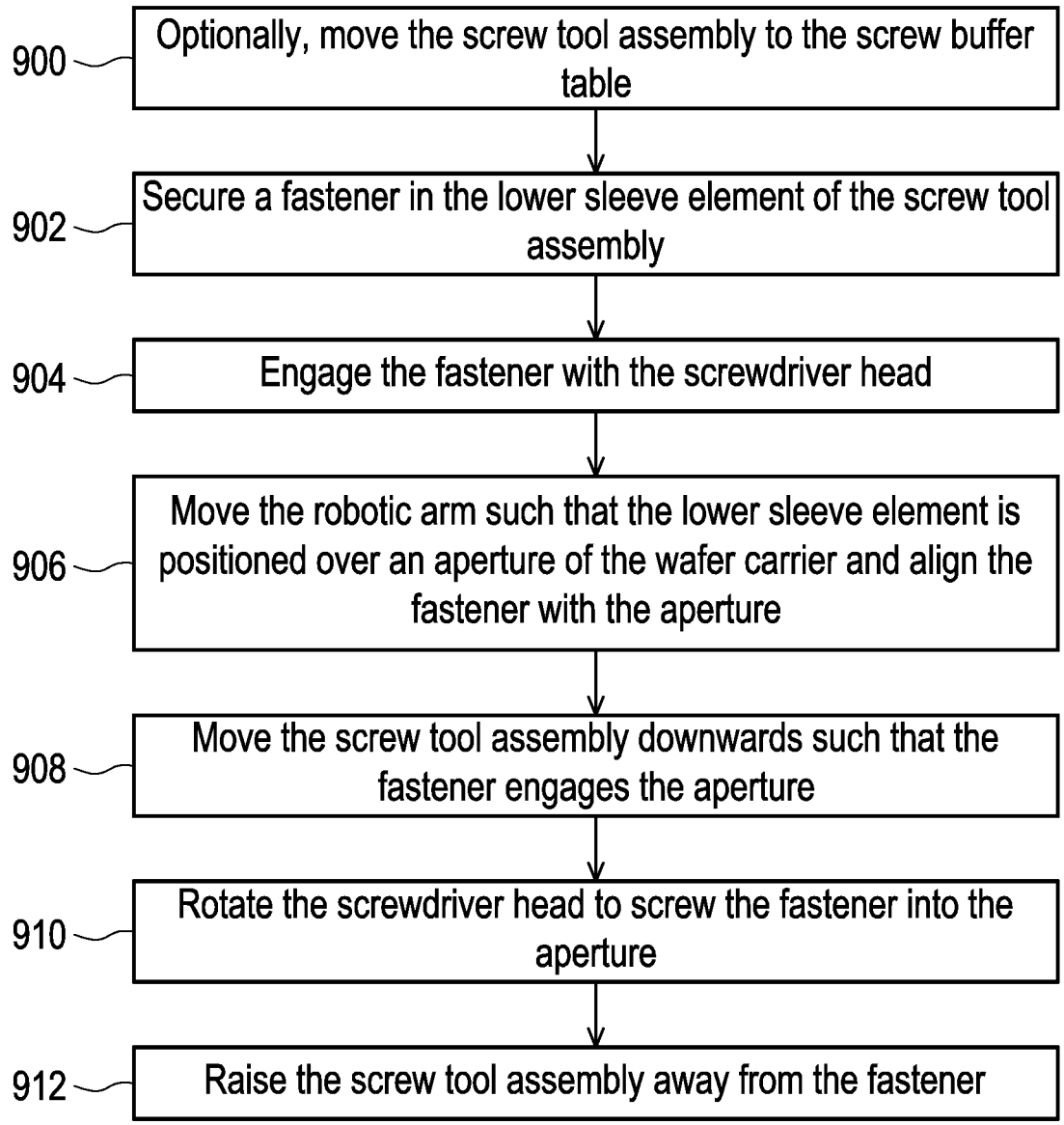
FIG. 9 depicts a flow chart illustrating an exemplary method for inserting a fastener into a wafer carrier, in accordance with some embodiments of the present disclosure.

FIG. 9 is a flow chart illustrating an exemplary method for inserting a fastener into a wafer carrier in accordance with some embodiments of the present disclosure. This method is also illustrated in FIGS. 10A-10D, and will be discussed together.

Initially, in optional step 900, the robotic arm is moved to the screw buffer table. The screw tool assembly is then aligned with a fastener.

Next, in step 902, a fastener is secured in the lower sleeve element of the screw tool assembly. In step 904, the screw drive of the fastener is engaged by the screwdriver head located within the upper sleeve element. In step 906, the robotic arm is moved to position the lower sleeve element over an aperture of the wafer carrier and align the fastener with the aperture.

Figure 10B:
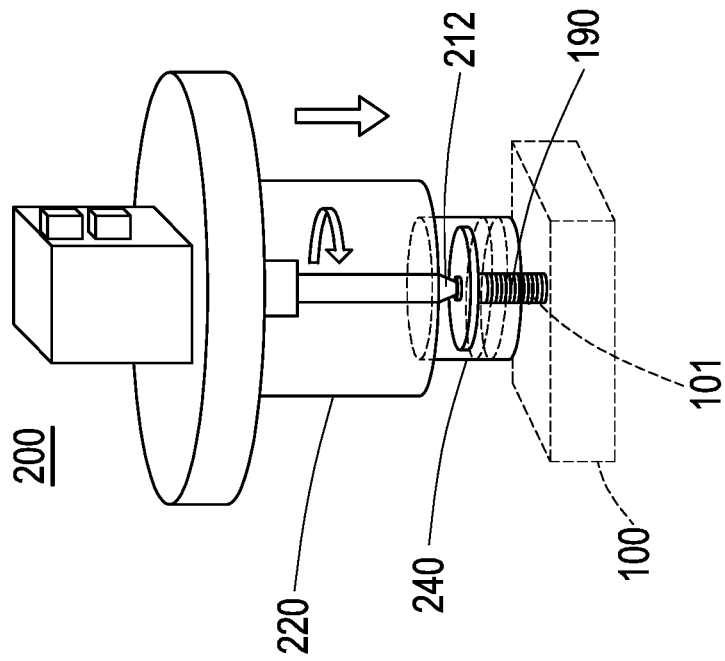
FIG. 10A-10D are a set of drawings illustrating the steps of the method of FIG. 9, in accordance with some embodiments.
Figure 10A:
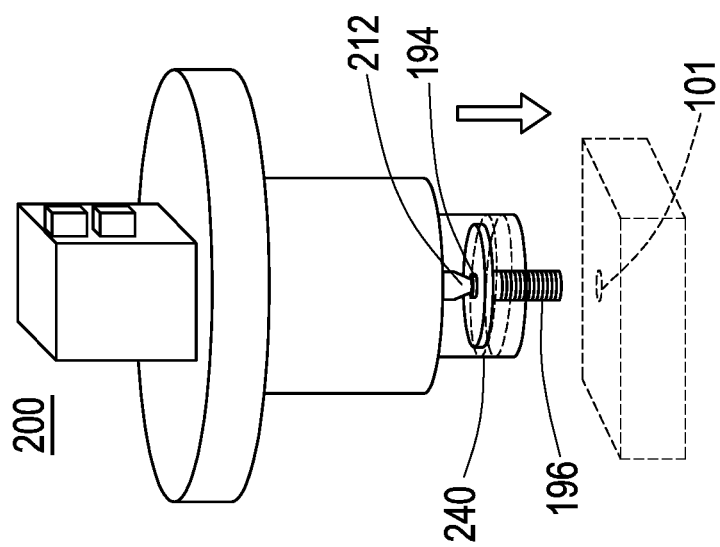

FIG. 10A shows the result after step 906. As seen here, the lower sleeve element 240 is positioned over aperture 101, and the fastener shank 196 is aligned with the aperture. The screw drive 194 of the fastener is engaged by the screwdriver head 212, which fixes the position of the fastener and reduces misalignment with the aperture 101.

Next, in step 908 and as illustrated in FIG. 10B, the screw tool assembly 200 is moved downwards such that the fastener 190 engages the aperture 101. Once the fastener engages the aperture, in step 910, the screwdriver head 212 begins rotating clockwise to screw the fastener into the aperture. The lower sleeve element 240 is pushed into the upper sleeve element 220 of the screw tool assembly as the fastener is screwed into the aperture.

Figure 10D:
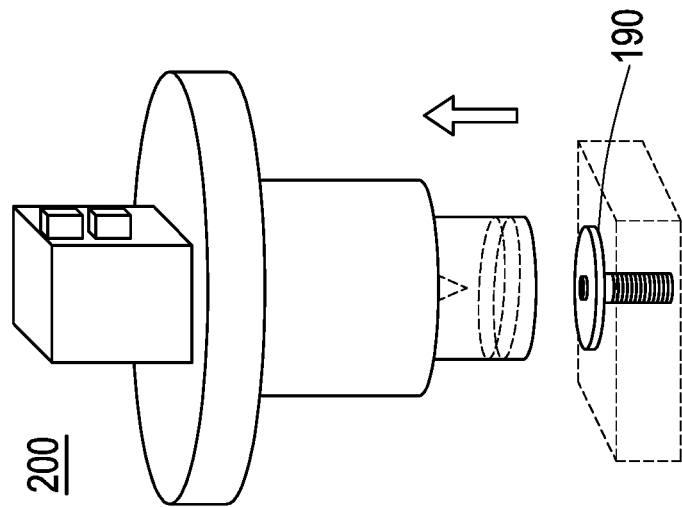
Figure 10C:
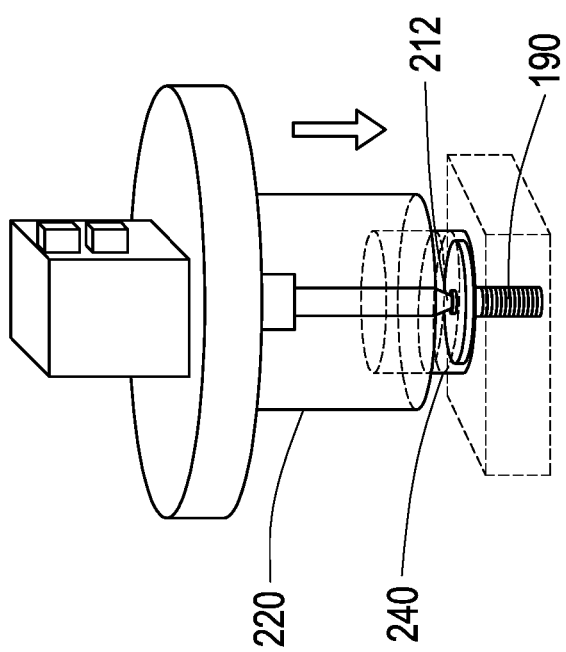

As seen in FIG. 10C, as the screwdriver head 212 tightens the fastener 190 into the aperture, the lower sleeve element 240 is pushed further into the upper sleeve element 220. Eventually, the fastener 190 disengages from the lower sleeve element and is secure in the aperture. The head of the fastener 190 is no longer engaged by the internal thread of the lower sleeve element.

In step 912 and as illustrated in FIG. 10D, the screw tool assembly 200 is raised away from the fastener 190. The screw tool assembly is now ready to collect another fastener.

Referring back to FIG. 1, it is particularly contemplated that the fasteners are located on the top surface of the wafer carrier. However, the robotic systems and methods disclosed above can be generally applied regardless of the surface upon which the fasteners are located. Generally, it should be sufficient that removal of the fastener(s) permits the door of the wafer carrier to be removed. The separation of the door from the wafer carrier can also be automated (using a different system).

Figure 11:
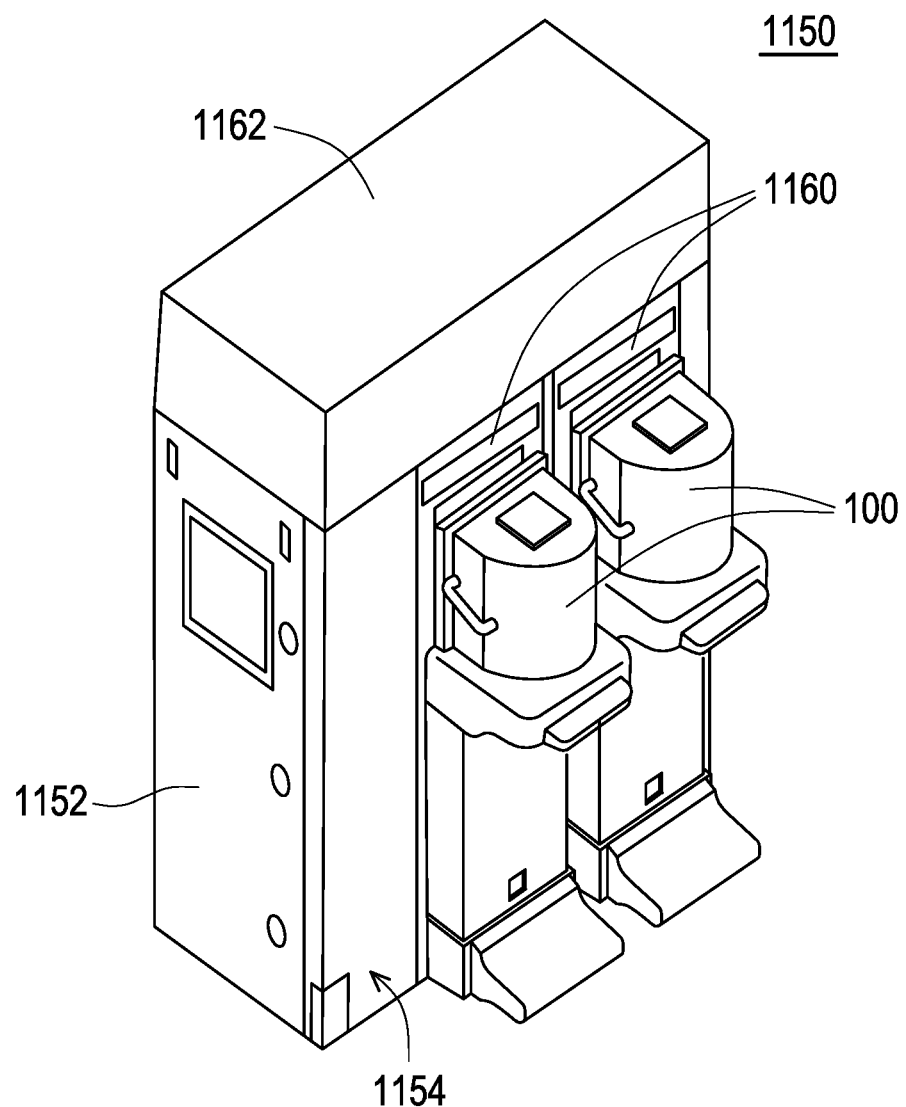
FIG. 11 is a front perspective view of an EFEM (Equipment Front End Module) that can be used with a wafer carrier.

Continuing, after the wafer carrier has been cleaned and the door has been reattached, semiconductor wafer substrates can be inserted into the wafer carrier. FIG. 11 is an exterior perspective view of an Equipment Front End Module (EFEM) 1150 which can be used for this purpose. An EFEM is a structure that is part of an automated material handling system (AMHS) for moving semiconductor wafer substrates between a wafer carrier (such as a FOUP) and a variety of different process modules. The EFEM takes the form of a four-sided housing 1152. The front side 1154 of the housing includes one or more load ports 1160. Two load ports are illustrated here. Each load port 1160 is configured in accordance with the FIMS (front-opening interface mechanical standard), to receive a wafer carrier 100 and access the contents thereof while protecting the contents from contaminants. The top of the housing includes a filter fan unit (FFU) 1162, which is a high quality unit that provides a laminar gas flow to the interior environment of the housing 1152. The floor of the EFEM is typically perforated, and the downward flow of air blows contaminants out of the interior and out of the EFEM. When the cleaned wafer carrier is mounted at a load port 1160, semiconductor wafer substrates can be loaded into the wafer carrier. The cleaned wafer carrier can also be hooked up to various systems as desired for maintaining the desired environment within the interior volume of the wafer carrier.

The robotic systems and methods disclosed above increase automation of additional steps for handling the wafer carriers. This reduces the need for manual handling, which improves the productivity of human operators and permits them to focus on tasks which cannot be automated.

Some embodiments of the present disclosure thus relate to systems for removing and affixing an associated fastener from an associated wafer carrier. The systems comprise a robotic arm having a screw tool assembly disposed at an operating end thereof. The screw tool assembly comprises an upper sleeve element and a lower sleeve element. The upper sleeve element has a screwdriver head disposed therein and a lower aperture. A motor is configured to rotate the screwdriver head. The lower sleeve element includes an internal thread having at least one turn. The lower sleeve is sized to fit within the upper sleeve and to move telescopically within the lower aperture of the upper sleeve element.

Also disclosed in various embodiments are methods of removing a fastener from a wafer carrier. A robotic arm is moved to position a screw tool assembly over the fastener, such that a lower sleeve element of the screw tool assembly surrounds a head of the fastener. The lower sleeve element includes an internal thread having at least one turn. The screw tool assembly is pushed downwards such that the lower sleeve element is pushed into an upper sleeve element of the screw tool assembly and a screw drive of the fastener is engaged by a screwdriver head within the upper sleeve element. The fastener is then unfastened by rotating the screwdriver head with a motor. The head of the fastener is captured by the internal thread of the lower sleeve element and separated from the wafer carrier.

Also disclosed are methods of screwing a fastener into a wafer carrier. A fastener is secured in the lower sleeve element of a screw tool assembly. The lower sleeve element includes an internal thread having at least one turn. The screw drive of the fastener is engaged with a screwdriver head located within an upper sleeve element of the screw tool assembly. A robotic arm is moved to position the lower sleeve element over an aperture of the wafer carrier and align the fastener with the aperture. The screw tool assembly is moved downwards such that the fastener engages the aperture. The fastener is then screwed into the aperture by rotating the screwdriver head with a motor. The lower sleeve element is pushed into the upper sleeve element of the screw tool assembly as the fastener is screwed into the aperture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of screwing a fastener into a wafer carrier, the method comprising
securing a fastener in a lower sleeve element of a screw tool assembly, the lower sleeve element including an internal thread having at least one turn, by engaging a head of the fastener with the internal thread of the lower sleeve element;
engaging a screw drive of the fastener with a screwdriver head located within an upper sleeve element of the screw tool assembly;
moving a robotic arm to position the lower sleeve element over an aperture of the wafer carrier and align the fastener with the aperture;
moving the screw tool assembly downwards such that the fastener engages the aperture; and
screwing the fastener into the aperture by rotating the screwdriver head with a motor, wherein the lower sleeve element is pushed into the upper sleeve element of the screw tool assembly as the fastener is screwed into the aperture.

2. The method of claim 1, further comprising moving the screw tool assembly upwards after the fastener is screwed into the aperture.

3. The method of claim 1, wherein the fastener is secured in the lower sleeve element at a screw buffer table.

4. The method of claim 3, wherein the screw buffer table comprises a plurality of apertures for holding a plurality of fasteners.

5. The method of claim 1, wherein a camera attached to the screw tool assembly is used to position the screw tool assembly over the fastener.

6. The method of claim 1, wherein a width of the lower sleeve element is greater than a diameter of the head of the fastener.

7. The method of claim 1, wherein a thread pitch of the internal thread of the lower sleeve element is greater than a height of the head of the fastener.

8. The method of claim 7, wherein a ratio of the thread pitch to the fastener head height is about 1.2 or greater.

9. The method of claim 1, wherein the internal thread has a minimum thread depth of about 0.5 mm.

10. The method of claim 1, wherein a lower thread angle and an upper thread angle of the internal thread are equal to each other.

11. The method of claim 10, wherein the lower thread angle and the upper thread angle are from greater than 90° to about 170°.

12. The method of claim 1, further comprising moving the screw tool assembly downwards as the fastener is screwed into the aperture.

13. The method of claim 1, wherein the movement of the robotic arm and the screw tool assembly is controlled automatically or manually.

14. A method of screwing a fastener into a wafer carrier, the method comprising
receiving the wafer carrier at an exit load port of a system that also comprises a robotic arm having a screw tool assembly disposed at an operating end thereof, wherein the screw tool assembly comprises:
an upper sleeve element having a screwdriver head disposed therein and a lower aperture;
a motor configured to rotate the screwdriver head; and
a lower sleeve element including an internal thread having at least one turn, the lower sleeve being sized to fit within the upper sleeve and to move telescopically within the lower aperture of the upper sleeve element;
securing a fastener in the lower sleeve element of the screw tool assembly by engaging a head of the fastener with the internal thread of the lower sleeve element;
engaging a screw drive of the fastener with the screwdriver head;
moving the robotic arm to position the lower sleeve element over an aperture of the wafer carrier and align the fastener with the aperture;
moving the screw tool assembly downwards so that the fastener engages the aperture; and
screwing the fastener into the aperture by rotating the screwdriver head with the motor, wherein the lower sleeve element is pushed into the upper sleeve element of the screw tool assembly as the fastener is screwed into the aperture.

15. The method of claim 14, further comprising moving the screw tool assembly upwards after the fastener is screwed into the aperture.

16. The method of claim 14, wherein a camera attached to the screw tool assembly is used to position the screw tool assembly over the fastener.

17. The method of claim 14, wherein a width of the lower sleeve element is greater than a diameter of the head of the fastener.

18. The method of claim 14, wherein a thread pitch of the internal thread of the lower sleeve element is greater than a height of the head of the fastener.

19. A method of screwing a fastener into a wafer carrier, the method comprising
aligning a screw tool assembly disposed at an operating end of a robotic arm with a fastener;
securing the fastener in a lower sleeve element of the screw tool assembly, the lower sleeve element including an internal thread having at least one turn, by engaging a head of the fastener with the internal thread of the lower sleeve element;
engaging a screw drive of the fastener with a screwdriver head located within an upper sleeve element of the screw tool assembly;
moving the robotic arm to position the lower sleeve element over an aperture of the wafer carrier and align the fastener with the aperture;
moving the screw tool assembly downwards such that the fastener engages the aperture; and
screwing the fastener into the aperture by rotating the screwdriver head with a motor, wherein the lower sleeve element is pushed into the upper sleeve element of the screw tool assembly as the fastener is screwed into the aperture.

20. The method of claim 19, further comprising moving the screw tool assembly upwards after the fastener is screwed into the aperture.

\* \* \* \* \*